United States Patent
Yoshimizu et al.

(10) Patent No.: US 8,741,168 B2
(45) Date of Patent: Jun. 3, 2014

(54) WET ETCHING METHOD FOR SILICON NITRIDE FILM

(75) Inventors: Yasuhito Yoshimizu, Kanagawa-ken (JP); Hisashi Okuchi, Kanagawa-ken (JP); Hiroshi Tomita, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 127 days.

(21) Appl. No.: 13/424,904

(22) Filed: Mar. 20, 2012

(65) Prior Publication Data
US 2013/0065400 A1 Mar. 14, 2013

(30) Foreign Application Priority Data
Sep. 12, 2011 (JP) .................................. 2011-197977

(51) Int. Cl.
*C03C 15/00* (2006.01)

(52) U.S. Cl.
USPC ............... 216/99; 216/93; 257/618; 438/745; 438/750; 438/757

(58) Field of Classification Search
USPC ........ 216/93, 99; 257/618; 438/745, 757, 750
See application file for complete search history.

(56) References Cited

U.S. PATENT DOCUMENTS

| | | | | |
|---|---|---|---|---|
| 6,001,215 A | * | 12/1999 | Ban | 156/345.15 |
| 6,303,514 B1 | * | 10/2001 | Hackett et al. | 438/745 |
| 6,666,986 B1 | * | 12/2003 | Vaartstra | 252/79.1 |
| 7,635,397 B2 | | 12/2009 | Okuchi | |
| 8,143,703 B2 | * | 3/2012 | Heald et al. | 257/618 |
| 2012/0112321 A1 | * | 5/2012 | Holdermann | 257/618 |
| 2012/0264308 A1 | | 10/2012 | Watanabe et al. | |

FOREIGN PATENT DOCUMENTS

JP 2010-74060 4/2010

OTHER PUBLICATIONS

Notification of Reason(s) for Refusal issued by the Japanese Patent Office on Nov. 18, 2013, for Japanese Patent Application No. 2011-197977, and English-language translation thereof.

* cited by examiner

*Primary Examiner* — Nadine Norton
*Assistant Examiner* — Maki Angadi
(74) *Attorney, Agent, or Firm* — Finnegan, Henderson, Farabow, Garrett & Dunner, L.L.P.

(57) ABSTRACT

According to one embodiment, an etching method includes: supplying an etching-resistant material; and etching the silicon nitride film. The supplying includes supplying the etching-resistant material to a processing surface including a surface of a silicon nitride film and a surface of a non-etching film, the non-etching film including a material different from the silicon nitride film. The etching includes etching the silicon nitride film using an etchant in a state of the etching-resistant material being formed relatively more densely on the surface of the non-etching film than on the surface of the silicon nitride film.

18 Claims, 3 Drawing Sheets

WET ETCHING METHOD FOR SILICON NITRIDE FILM

CROSS-REFERENCE TO RELATED APPLICATIONS

This application is based upon and claims the benefit of priority from the prior Japanese Patent Application No. 2011-197977, filed on Sep. 12, 2011; the entire contents of which are incorporated herein by reference.

FIELD

Embodiments described herein relate generally to an etching method.

BACKGROUND

Hot phosphoric acid solutions are generally used as etchants to perform wet etching of silicon nitride selectively with respect to silicon oxide. However, the characteristics of hot phosphoric acid solutions are such that the silicon oxide also is undesirably etched, albeit at about one-thirtieth of the etching rate of silicon nitride.

DETAILED DESCRIPTION

Figure 1A:
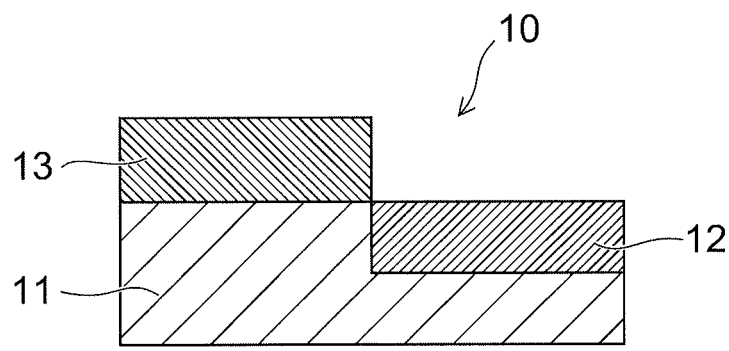
FIGS. 1A to 1D are schematic cross-sectional views illustrating an etching method of a first embodiment.

In general, according to one embodiment, an etching method includes: supplying an etching-resistant material; and etching the silicon nitride film. The supplying includes supplying the etching-resistant material to a processing surface including a surface of a silicon nitride film and a surface of a non-etching film, the non-etching film including a material different from the silicon nitride film. The etching includes etching the silicon nitride film using an etchant in a state of the etching-resistant material being formed relatively more densely on the surface of the non-etching film than on the surface of the silicon nitride film.

Embodiments will now be described with reference to the drawings. Similar components in the drawings are marked with like reference numerals.

FIRST EMBODIMENT

FIGS. 1A to 1D are schematic cross-sectional views illustrating an etching method of a first embodiment.

FIG. 1A is a schematic cross section of main components of a wafer 10 to be processed according to the embodiment. The wafer 10 includes, for example, a silicon substrate 11 as a substrate.

A silicon nitride film 13 is formed on the silicon substrate 11 as an object of etching using a hot phosphoric acid solution as the etchant. The silicon nitride film 13 is not limited to being directly formed on the silicon substrate 11 and may be formed on the silicon substrate 11 with another semiconductor film, an insulating film, a conductive film, or the like interposed.

A silicon oxide film 12 is formed in a region adjacent to the region where the silicon nitride film 13 is formed. The silicon oxide film 12 is a non-etching film that is not an object of the etching using the hot phosphoric acid solution. The silicon oxide film 12 is formed directly on the silicon substrate 11 or with another semiconductor film, an insulating film, a conductive film, or the like interposed.

In other words, the silicon nitride film 13, which is the object of the etching using the hot phosphoric acid solution, is formed on the same silicon substrate 11 as the silicon oxide film 12, which is formed as the non-etching film which is not the object of the etching using the hot phosphoric acid solution.

The surface of the silicon nitride film 13 and the surface of the silicon oxide film 12 are exposed; and the surface that includes the surface of the silicon nitride film 13 and the surface of the silicon oxide film 12 is the processing surface. It is unnecessary for a difference in levels to exist between the surface of the silicon nitride film 13 and the surface of the silicon oxide film 12; and the surface of the silicon nitride film 13 and the surface of the silicon oxide film 12 may be coplanar.

According to the first embodiment, the etching of the silicon nitride film 13 is performed using the hot phosphoric acid solution after pre-forming the hot phosphoric acid-resistant material as the etching-resistant material on the surface of the silicon oxide film 12.

For example, the hot phosphoric acid-resistant material is supplied to the processing surface by immersing the wafer 10 in a solution of the hot phosphoric acid-resistant material. Alternatively, for example, a solution of the hot phosphoric acid-resistant material is supplied to the processing surface or a vapor of the hot phosphoric acid-resistant material is supplied to the processing surface by spin coating.

Or, a film of the hot phosphoric acid-resistant material also may be formed on the processing surface by chemical vapor deposition (CVD), atomic layer deposition (ALD), molecular layer deposition (MLD), and the like.

Figure 1B:
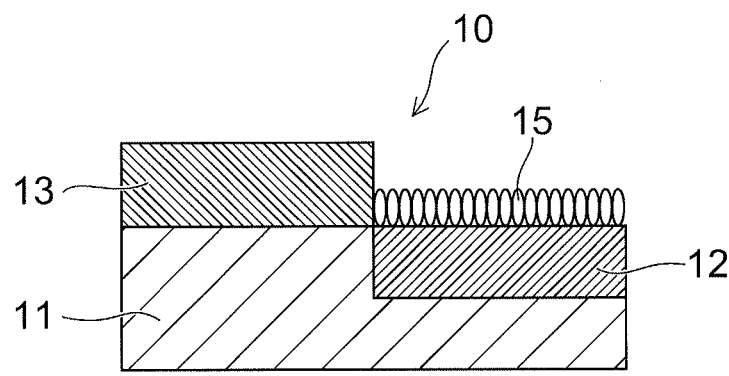

As illustrated in FIG. 1B, the hot phosphoric acid-resistant material is formed on the surface of the silicon oxide film 12 as, for example, a self-assembled monolayer (SAM) 15.

The SAM 15 is formed relatively more densely on the surface of the silicon oxide film 12 than on the surface of the silicon nitride film 13. Restated, the SAM 15 is relatively more sparse on the surface of the silicon nitride film 13 than on the surface of the silicon oxide film 12. Herein, being relatively sparse includes the case where the SAM 15 is not formed.

In other words, the SAM 15 substantially is not formed on the surface of the silicon nitride film 13. Alternatively, even in the case where the SAM 15 is formed on the surface of the silicon nitride film 13, the density of the SAM 15 is low and the surface of the silicon nitride film 13 is not covered with the SAM 15.

The SAM 15 is an organic monolayer that is chemisorbed to the surface of the silicon oxide film 12. Under some conditions, in the process of the chemisorption, an organic monolayer having uniform orientation of the molecules is formed on the surface of the silicon oxide film 12 by the adsorbed molecules spontaneously aggregating densely due to interactions between the organic molecules. The surface of the silicon oxide film 12 is covered with the molecules and the growth of the film stops when the monolayer film is formed because further adsorption reactions do not occur when there are no more reaction sites on the surface of the silicon oxide film 12. Because the surfaces of the SAM 15 and the silicon oxide film 12 are securely bonded by covalent bonds, the surfaces of the SAM 15 and the silicon oxide film 12 are stable with respect to the hot phosphoric acid solution.

The SAM 15 includes, for example, a silane coupling agent that undergoes a silane coupling reaction with an OH group (hydroxy group) as a linker having affinity and reactivity with inorganic materials. The linker includes a functional group that chemisorbs to the surface of the silicon oxide film 12. A silanol group, a hydroxy group, an amine group, an azo group, a phosphonyl (phosphonic acid) group, an epoxy group, and a hydrido group are examples of such a functional group.

The SAM 15 is selectively formed on the surface of the silicon oxide film 12 which includes more OH groups than the surface of the silicon nitride film 13. The surface of the silicon oxide film 12 is covered with the SAM 15; and the SAM 15 does not permit the penetration of the hot phosphoric acid solution into the silicon oxide film 12 surface. The surface of the silicon nitride film 13 is not covered with the SAM 15; and the hot phosphoric acid solution can penetrate into the surface of the exposed silicon nitride film 13.

When the SAM 15 is formed on the surface of the silicon oxide film 12, the surface of the silicon oxide film 12 is covered with one other terminal functional group that is on the side opposite to the functional group that is chemisorbed to the silicon oxide film 12. The terminal functional group is a functional group that is hot phosphoric acid-resistant and includes a carbon-carbon bond, a carbon-hydrogen bond, or a carbon-fluorine bond; and examples of the terminal functional group include, for example, a fluorocarbon group, an alkyl group, and a perfluoroalkyl group.

The silicon nitride film 13 is etched using the hot phosphoric acid solution at a temperature (e.g., 150° C. to 160° C.) not less than the boiling point of water in the state in which the surface of the silicon oxide film 12 is covered with the SAM 15. For example, the wafer 10 is immersed in the hot phosphoric acid solution. Alternatively, the hot phosphoric acid solution is supplied to the surface of the wafer 10.

Figure 1C:
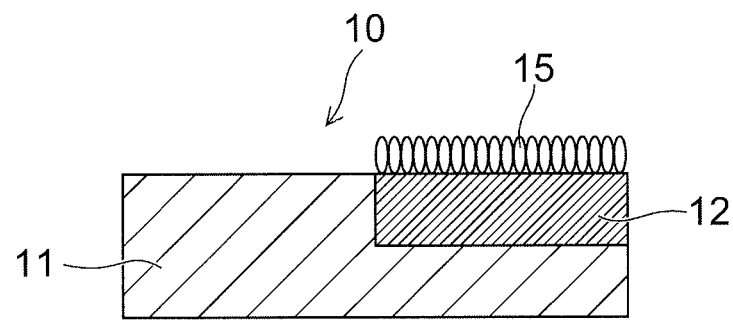

During this etching, the surface of the silicon oxide film 12 is protected by the SAM 15. Therefore, as illustrated in FIG. 1C, only the silicon nitride film 13 can be removed by the selective etching without the silicon oxide film 12 being etched.

In other words, according to this embodiment, the etching selectivity of the silicon nitride film 13 with respect to the silicon oxide film 12 can be increased during the etching of the silicon nitride film 13 using the hot phosphoric acid solution. As a result, fluctuation and degradation of the device characteristics caused by undesired etching of the silicon oxide film 12 can be prevented.

Figure 1D:
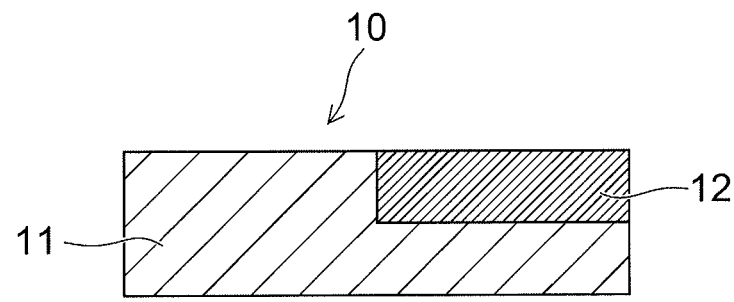

After the hot phosphoric acid treatment, as illustrated in FIG. 1D, the SAM 15 may be removed by, for example, oxidation treatment such as an ashing process, etc. Even if the SAM 15 is not removed at this time, there are cases where the SAM 15 is removed in a subsequent process. Also, the SAM 15 may remain if there are no effects on the device characteristics and the subsequent processes.

SECOND EMBODIMENT

FIGS. 2A to 2D are schematic cross-sectional views illustrating an etching method of a second embodiment.

Figure 2A:
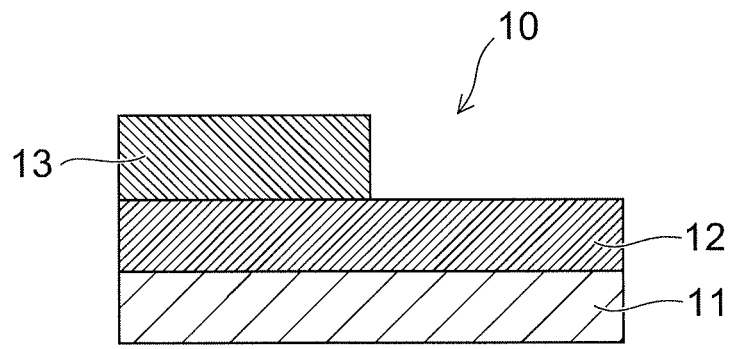
FIGS. 2A to 2D are schematic cross-sectional views illustrating an etching method of a second embodiment.

In the case where the silicon nitride film 13 which is the film to be etched is formed on the surface of a portion of the silicon oxide film 12 which is the non-etching film as illustrated in FIG. 2A, the silicon oxide film 12 is exposed at a portion where the silicon nitride film 13 has been removed by etching. The SAM 15 cannot be pre-formed on the surface of the silicon oxide film 12 that is covered with the silicon nitride film 13 prior to the etching.

Figure 2B:
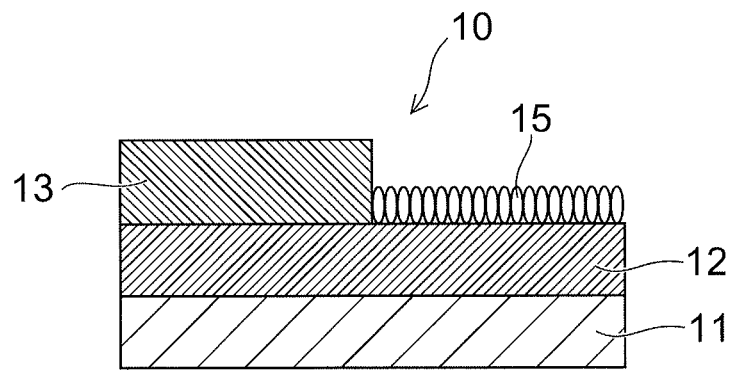

As illustrated in FIG. 2B, similarly to the first embodiment recited above, the SAM 15 can be formed on the surface of the silicon oxide film 12 that is not covered with the silicon nitride film 13.

In the second embodiment, after the process of FIG. 2B, the etching of the silicon nitride film 13 is performed using a hot phosphoric acid solution into which the SAM 15 is added. Because the SAM 15 is added to the hot phosphoric acid solution, the SAM 15 can be formed on the surface of the silicon oxide film 12 during the etching of the silicon nitride film 13 using the hot phosphoric acid solution.

Figure 2C:
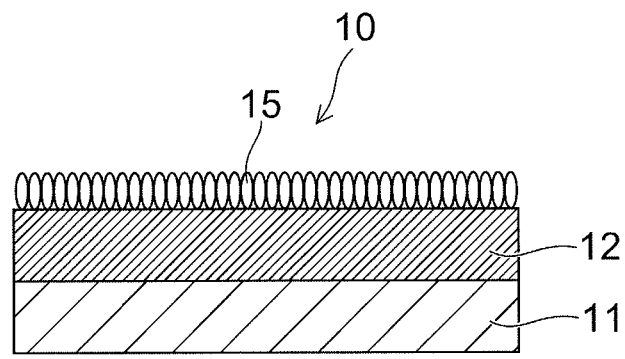

Accordingly, as illustrated in FIG. 2C, the SAM 15 can be formed also on the surface of the silicon oxide film 12 under the portion of the silicon nitride film 13 that is removed. As a result, etching of the silicon oxide film 12 by the hot phosphoric acid solution can be suppressed.

Figure 2D:
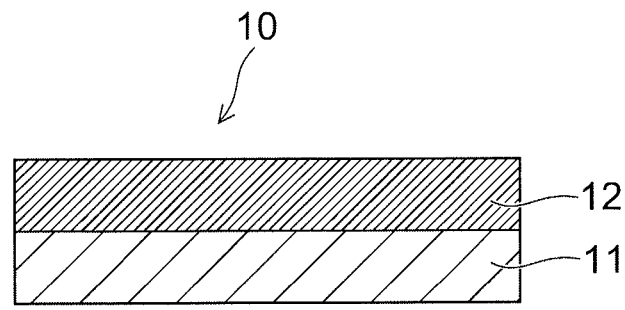

After the hot phosphoric acid treatment as illustrated in FIG. 2D, the SAM 15 may be removed by, for example, oxidation treatment such as an ashing process, etc.

It is desirable for a solvent that has an affinity with water also to be added to the hot phosphoric acid solution such that the SAM 15 is dispersed in the hot phosphoric acid solution without decomposing. Isopropyl alcohol is an example of such a solvent.

THIRD EMBODIMENT

Figure 3A:
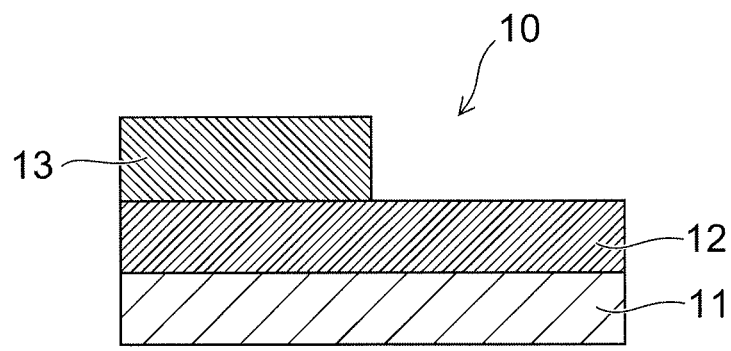
FIGS. 3A to 3C are schematic cross-sectional views illustrating an etching method of a third embodiment.
Figure 3B:
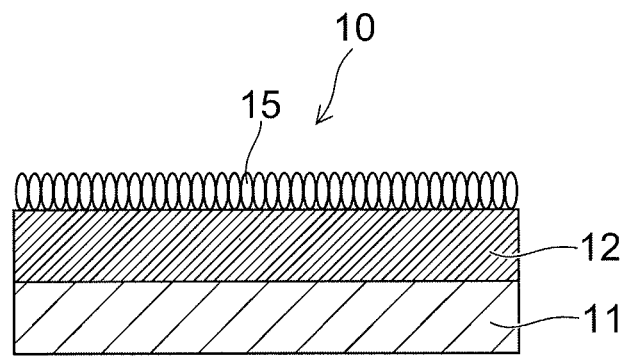
Figure 3C:
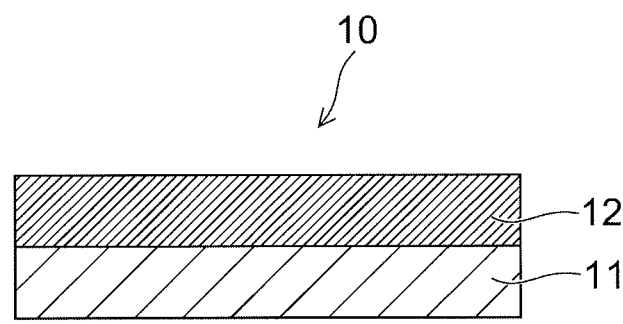

FIGS. 3A to 3C are schematic cross-sectional views illustrating an etching method of a third embodiment.

Similarly to the second embodiment, in the case where the silicon nitride film 13 is formed on the silicon oxide film 12 as illustrated in FIG. 3A, the etching of the silicon nitride film 13 may be performed using the hot phosphoric acid solution into which the SAM 15 is added without pre-forming the SAM 15 on the surface of the silicon oxide film 12 that is not covered with the silicon nitride film 13.

In other words, according to the third embodiment, the SAM 15 is formed during the etching of the silicon nitride film 13 using the hot phosphoric acid solution as illustrated in FIG. 3B on the surface of the silicon oxide film 12 that is not covered with the silicon nitride film 13 and on the surface of the silicon oxide film 12 under the portion of the silicon nitride film 13 that is removed. As a result, the etching of the silicon oxide film 12 by the hot phosphoric acid solution can be suppressed.

After the hot phosphoric acid treatment as illustrated in FIG. 3C, the SAM 15 may be removed, for example, by oxidation treatment such as an ashing process, etc.

The non-etching film that is protected from the hot phosphoric acid solution by being covered with the hot phosphoric acid-resistant material is not limited to being a silicon oxide film and may be, for example, a metal film and the like. The hot phosphoric acid-resistant material formed on the metal film may include, for example, a thiol and a phosphonyl (phosphonic acid).

Other than the hot phosphoric acid solution, the etchant may be an etchant including hydrofluoric acid or an etchant including hydrofluoric acid and ethylene glycol. Even in the case where such etchants are used, the etching selectivity of the silicon nitride film with respect to the silicon oxide film can be increased by using the same etching-resistant material (SAM 15) as that of the case of the hot phosphoric acid solution as a mask.

Although the chemical bond between the silicon oxide film and the etching-resistant functional group of the SAM 15 described above is easily etched by any of the etchants recited above, the silicon oxide film surface can be protected reliably from the etchant by forming the SAM 15 as a monolayer.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. An etching method, comprising:
supplying an etching-resistant material to a processing surface including a surface of a silicon nitride film and a surface of a non-etching film, the non-etching film including a material different from the silicon nitride film; and
etching the silicon nitride film using an etchant in a state of the etching-resistant material being formed relatively more densely on the surface of the non-etching film than on the surface of the silicon nitride film,
wherein the etching-resistant material is an organic monolayers formed as a self-assembled monolayer (SAM) on the surface of the non-etching film, and
the etching-resistant material includes a fluorocarbon group, the fluorocarbon group being hot phosphoric acid-resistant and included as a terminal functional group on a side opposite to a functional group chemisorbed to the non-etching film.

2. The method according to claim 1, wherein the etchant is a hot phosphoric acid solution.

3. The method according to claim 2, wherein the terminal functional group includes a carbon-hydrogen bond.

4. The method according to claim 2, wherein the terminal functional group includes a carbon-fluorine bond.

5. The method according to claim 2, wherein the terminal functional group includes a carbon-carbon bond.

6. The method according to claim 1, wherein the etchant includes hydrofluoric acid.

7. The method according to claim 6, wherein the etchant further includes ethylene glycol.

8. The method according to claim 1, wherein the etching-resistant material includes a silane coupling agent as a linker chemisorbed to the non-etching film.

9. The method according to claim 1, wherein the non-etching film is a silicon oxide film.

10. The method according to claim 9, wherein the etching-resistant material includes a silane coupling agent configured to undergo a silane coupling reaction with an OH group.

11. The method according to claim 1, wherein the etchant is supplied to the surface of the silicon nitride film after the etching-resistant material is pre-formed on the surface of the non-etching film.

12. The method according to claim 1, wherein the etching-resistant material is added to the etchant, the etchant is supplied to the processing surface, and the etching-resistant material is formed on the surface of the non-etching film during the etching of the silicon nitride film using the etchant.

13. The method according to claim 12, wherein the etchant includes a hot phosphoric acid solution and a solvent, the solvent having an affinity with water.

14. The method according to claim 13, wherein the solvent is isopropyl alcohol.

15. The method according to claim 12, wherein the silicon nitride film is formed on a surface of a portion of the non-etching film.

16. The method according to claim 1, wherein the non-etching film is a metal film.

17. The method according to claim 16, wherein the etching-resistant material includes a thiol.

18. The method according to claim 16, wherein the etching-resistant material includes a phosphoryl.

* * * * *